(12) United States Patent
Lee et al.

(10) Patent No.: US 10,770,602 B1
(45) Date of Patent: Sep. 8, 2020

(54) OPTICAL SENSOR AND METHOD FOR FORMING THE SAME

(71) Applicant: Vanguard International Semiconductor Corporation, Hsinchu (TW)

(72) Inventors: Hsin-Hui Lee, Kaohsiung (TW); Han-Liang Tseng, Hsinchu (TW); Jiunn-Liang Yu, Taipei (TW); Kwang-Ming Lin, Taichung (TW); Yin Chen, Hsinchu (TW); Si-Twan Chen, Jhubei (TW); Hsueh-Jung Lin, Jhubei (TW); Wen-Chih Lu, New Taipei (TW); Ting-Jung Lu, Taoyuan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/280,281

(22) Filed: Feb. 20, 2019

(51) Int. Cl.
*H01L 31/0232* (2014.01)
*H01L 31/0216* (2014.01)
*H01L 27/144* (2006.01)

(52) U.S. Cl.
CPC .. *H01L 31/02327* (2013.01); *H01L 31/02164* (2013.01); *H01L 27/1446* (2013.01)

(58) Field of Classification Search
None
See application file for complete search history.

(56) References Cited

U.S. PATENT DOCUMENTS

| | | | | |
|---|---|---|---|---|
| 2005/0236553 | A1* | 10/2005 | Noto | H01L 27/14621 250/208.1 |
| 2007/0053037 | A1* | 3/2007 | Kang | H01L 27/14621 359/204.1 |
| 2011/0233703 | A1* | 9/2011 | Nakamura | H01L 27/1446 257/432 |
| 2013/0200251 | A1* | 8/2013 | Velichko | H01L 31/02327 250/208.1 |
| 2018/0138329 | A1* | 5/2018 | Lin | H01L 27/14621 |
| 2018/0233531 | A1 | 8/2018 | Huang et al. | |

OTHER PUBLICATIONS

Taiwanese Office Action and Search Report dated Aug. 7, 2019, for corresponding Taiwanese Application No. 107138786.

\* cited by examiner

*Primary Examiner* — Steven M Christopher
(74) *Attorney, Agent, or Firm* — Birch, Stewart, Kolasch & Birch, LLP

(57) ABSTRACT

An optical sensor includes pixels disposed in a substrate and a light collimating layer disposed on the substrate. The light collimating layer includes a first light-shielding layer, first transparent pillars, a second light-shielding layer, and second transparent pillars. The first light-shielding layer is disposed on the substrate. The first transparent pillars through the first light-shielding layer are correspondingly disposed on the pixels. The second light-shielding layer is disposed on the first light-shielding layer and the first transparent pillars. The second transparent pillars through the second light-shielding layer are correspondingly disposed on the first transparent pillars. The top surface area of each of the first transparent pillars is not equal to the bottom surface area of each of the second transparent pillars.

19 Claims, 11 Drawing Sheets

OPTICAL SENSOR AND METHOD FOR FORMING THE SAME

BACKGROUND

Technical Field

The disclosure relates to an optical device, and more particularly to an optical sensor and a method for forming the same.

Description of the Related Art

Optical devices in an optical sensor may include a light collimator, a beam splitter, a focusing lens, and a linear sensor. The function of the light collimator is to collimate light to reduce power consumption caused by light divergence. For example, the light collimator may be applied in optical sensors to increase the efficiency of fingerprint sensor devices.

The light collimator includes transparent pillars and a light-shielding layer surrounding the transparent pillars in order to collimate light. When the transparent pillars are required to have a high aspect ratio due to design demands, the process capability limitation may easily cause the deformation and collapse of the transparent pillars. The collimating result may be affected and further affecting the yield of the optical sensors.

Although existing optical sensors have generally been adequate for their intended purposes, they have not been entirely satisfactory in all respects and need to be improved. The aspect ratio of the light collimator of the optical sensors in particular needs to be increased.

BRIEF SUMMARY

The present disclosure provides an optical sensor. The optical sensor includes pixels disposed in a substrate and a light collimating layer disposed on the substrate. The light collimating layer includes a first light-shielding layer, first transparent pillars, a second light-shielding layer, and second transparent pillars. The first light-shielding layer is disposed on the substrate. The first transparent pillars through the first light-shielding layer are correspondingly disposed on the pixels. The second light-shielding layer is disposed on the first light-shielding layer and the first transparent pillars. The second transparent pillars through the second light-shielding layer are correspondingly disposed on the first transparent pillars. The top surface area of each of the first transparent pillars is not equal to the bottom surface area of each of the second transparent pillars.

The present disclosure also provides a method for forming an optical sensor. The method for forming an optical sensor includes forming a plurality of pixels in a substrate. The method for forming an optical sensor further includes forming a light collimating layer on the substrate. Forming of the light collimating layer includes forming a plurality of first transparent pillars on the substrate. The first transparent pillars are correspondingly disposed on the pixels. Forming of the light collimating layer further includes forming a first light-shielding layer between the first transparent pillars. Forming of the light collimating layer further includes planarizing a top surface of the first transparent pillars and the first light-shielding layer. Forming of the light collimating layer further includes forming a plurality of second transparent pillars on the first transparent pillars and the first light-shielding layer. The second transparent pillars are correspondingly disposed on the first transparent pillars. Forming of the light collimating layer further includes forming a second light-shielding layer between the second transparent pillars. Forming of the light collimating layer further includes planarizing a top surface of the second transparent pillars and the second light-shielding layer. The top surface area of each of the first transparent pillars is not equal to the bottom surface area of each of the second transparent pillars.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
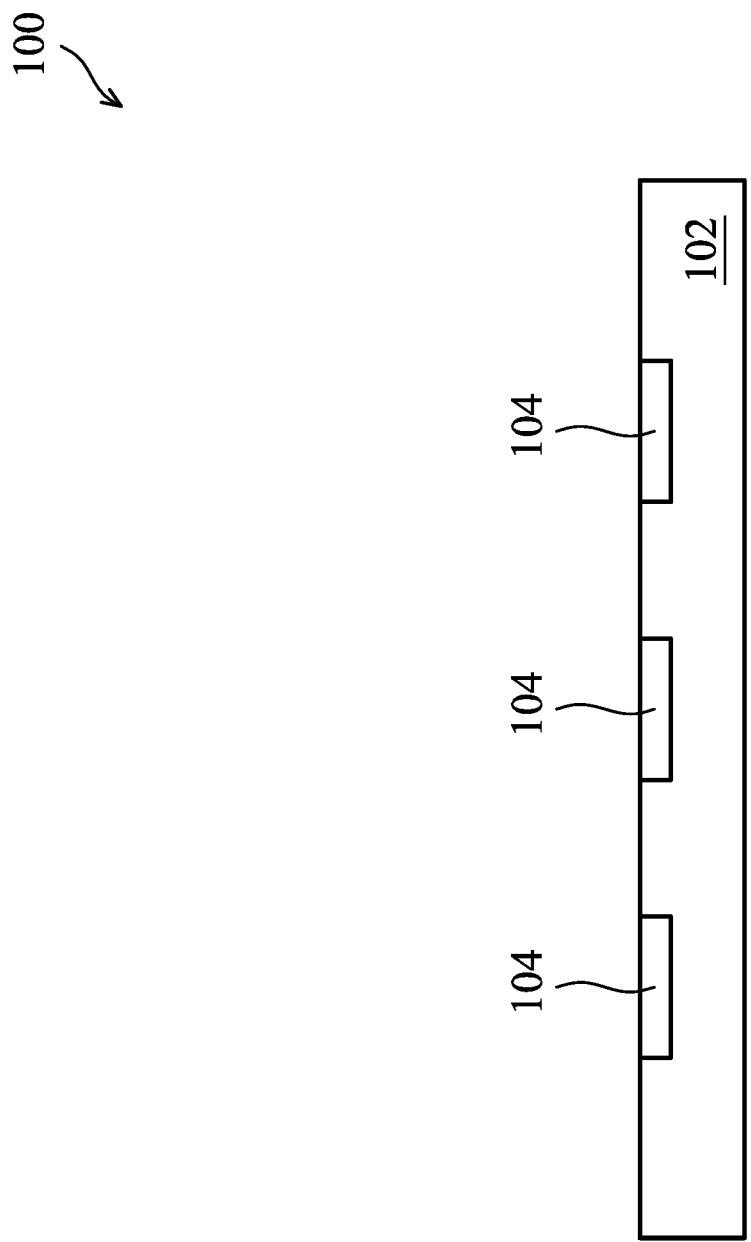
FIGS. 1-5 are cross-sectional representations of various stages of forming an optical sensor in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the optical sensor in the present disclosure. Some of the features described below can be replaced or eliminated for different embodiments.

The embodiments of the present disclosure provide an optical sensor. By stacking transparent pillars and light-shielding layers layer by layer, the light collimating layer is formed in a layered manner. The process capability limitation may be prevented, and the total aspect ratio of the transparent pillars may be raised. By changing the shape and the size of the transparent pillars in the cross-sectional view, the misalignment issue between multi-layer transparent pillars may be improved, and the production yield may be raised.

FIGS. 1 to 5 are cross-sectional representations of various stages of forming the optical sensor 100 in accordance with some embodiments of the present disclosure. As shown in FIG. 1, a substrate 102 is provided. The substrate 102 may be a semiconductor substrate, such as a silicon substrate. In addition, the semiconductor substrate may be elemental semiconductors including germanium; compound semiconductors including gallium nitride, silicon carbide, gallium arsenide, gallium phosphide, indium phosphide, indium arsenide, and/or indium antimonide; alloy semiconductors including SiGe, GaAsP, AlInAs, AlGaAs, GaInAs, GaInP, and/or GaInAsP, or a combination thereof. In some embodiments, the substrate 102 may also be a semiconductor on insulator (SOI) substrate. The above SOI substrate may include a base plate, a buried oxide (BOX) layer disposed on the base plate, and a semiconductor layer disposed on the buried oxide (BOX) layer. In addition, the conductivity type of the substrate 102 may be N-type or P-type.

In some embodiments, the substrate 102 may include various isolation features (not shown) to define active regions and electrically isolate devices in the active regions in or on the substrate 102. In some embodiments, the isolation features include shallow trench isolation (STI) features, local oxidation of silicon (LOCOS) features, other suitable isolation features, or combinations thereof. In some embodiments, forming the isolation features may include forming an insulating layer on the substrate 102, selectively etching the insulating layer and the substrate 102 to form trenches in the substrate 102, growing a nitrogen-rich (e.g., silicon oxynitride) liner layer in the trenches, filling insulating materials (e.g., silicon dioxide, silicon nitride, or silicon oxynitride) in the trenches by a deposition process, performing an annealing process on the insulating materials in the trenches, and performing a planarization process such as a chemical mechanical polishing (CMP) process on the substrate 102 to remove excess insulating materials such that the insulating materials in the trenches are level with the top surface of the substrate 102.

In some embodiments, the substrate 102 may include various P-type doped regions and/or N-type doped regions formed by an ion implantation and/or a diffusion process (not shown). In some embodiments, the doped regions may be formed into devices such as transistors, photodiodes, etc. However, these devices are merely examples, and the present disclosure is not limited thereto.

In some embodiments, the substrate 102 may include various conductive features, such as conductive lines or vias (not shown). For example, the conductive features may be formed by aluminum, copper, tungsten, other suitable conductive materials, an alloy thereof, or a combination thereof.

As shown in FIG. 1 in accordance with some embodiments, the substrate 102 may include pixels 104. The pixels 104 may include a photodetector and a readout circuit. The photodetector may include a photodiode, a charged coupling device (CCD) sensor, a complimentary metal-oxide-semiconductor (CMOS) image sensor, an active sensor, a passive sensor, other suitable sensors, or a combination thereof. The readout circuit may include a transfer transistor, a reset transistor, a source-follower transistor, a select transistor, one or more other suitable transistors, or a combination thereof. The pixels 104 may transform the received optical signals from the photodetector into electronic signals, and process the electronic signals by the readout circuit. In such cases, a pixel 104 may correspond to at least one photodetector, such as at least one photodiode. It should be noted that only a part of the pixels 104 are shown in FIG. 1, and the real number of the pixels 104 of the present disclosure are not limited thereto. In some embodiments, the pixels 104 are arranged in the substrate 102 in an array.

Figure 2:
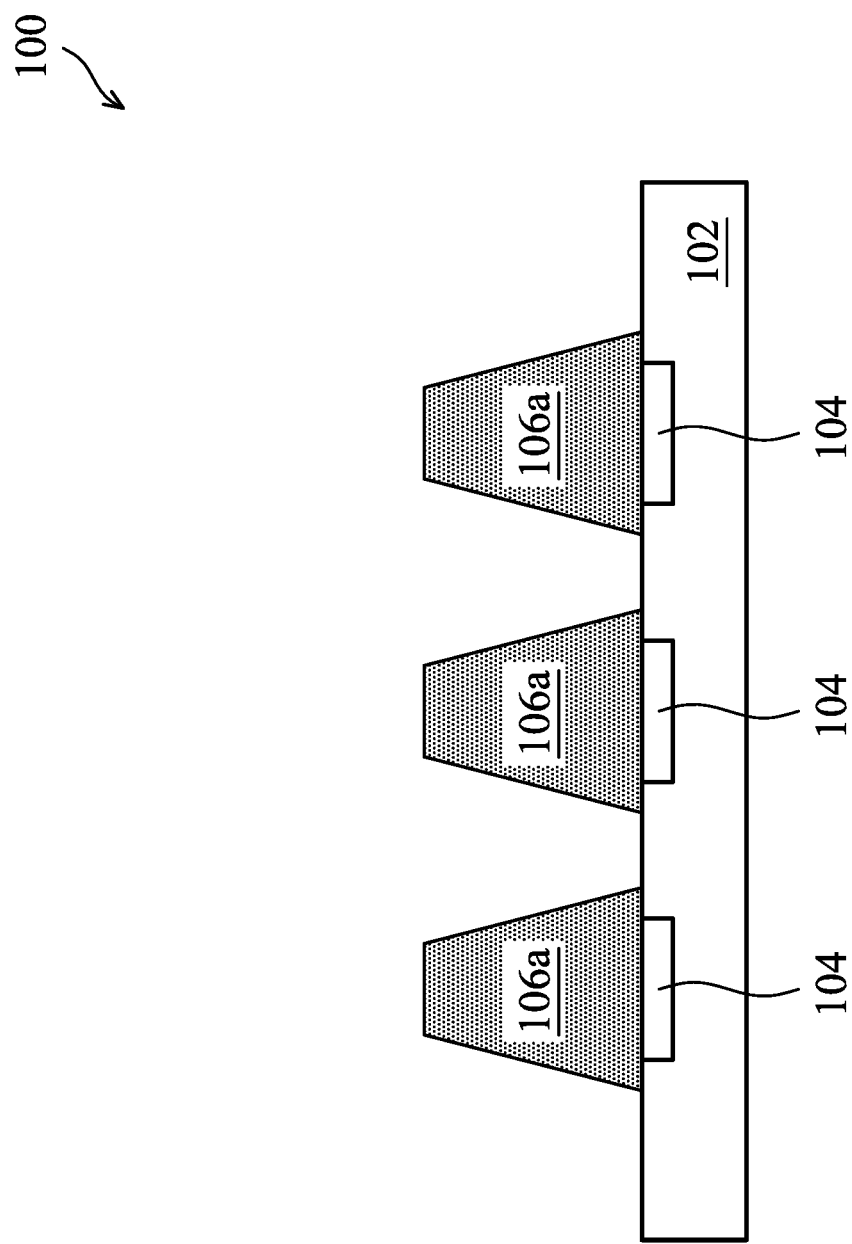

Next, as shown in FIG. 2, first transparent pillars 106a are formed on the substrate 102. In some embodiments, a transparent layer may be blanketly formed on the substrate 102 first. In some embodiments, the transparent layer may include a transparent material, which has a transmittance greater than 60% to a light with a wavelength in a range from 300 nm to 1100 nm. The transparent material may include a light-curable material, a thermosetting material, or a combination thereof. In some embodiments, the transparent material may include polymethyl methacrylate (PMMA), perfluorocyclobutyl (PFCB) polymer, polyimide (PI), epoxy resins, other suitable materials, or a combination thereof. In some embodiments, the transparent material may be deposited on the substrate 102 by a process such as spin-coating, chemical vapor deposition (CVD), physical vapor deposition (PVD) (e.g. evaporation or sputtering), electroplating, atomic layer deposition (ALD), other suitable processes, or a combination thereof Next, the transparent material of the substrate 102 is selectively removed. In some embodiments, the transparent material is selectively removed by a photolighography process and an etching process to form the first transparent pillars 106a corresponding to the pixels 104. In some embodiments, the photolighography process may include photoresist coating (e.g., spin-coating), soft baking, mask alignment, pattern exposure, post-exposure baking, photoresist developing, rinsing and drying (e.g., hard baking), other suitable processes, or a combination thereof. The etching process may include a dry etching process (e.g., reactive ion etch (RIE), plasma etching, or ion milling), a wet etching process, or a combination thereof. In some other embodiments, the first transparent pillars 106a may be formed directly by a curing process such as a light-curing process to cure the transparent materials and the unexposed portion is rinsed. The cross-sectional shape of the first transparent pillars 106a may be changed by tuning the exposure focal length in the patterning process. For example, as shown in FIG. 2, the first transparent pillars 106a in the cross-sectional views are upwardly tapered trapezoids. In some other embodiments, the first transparent pillars 106a may have some other shapes in the cross-sectional views, such as downwardly tapered trapezoids, rectangles, double concave shapes, other suitable shapes, or a combination thereof.

Figure 3:
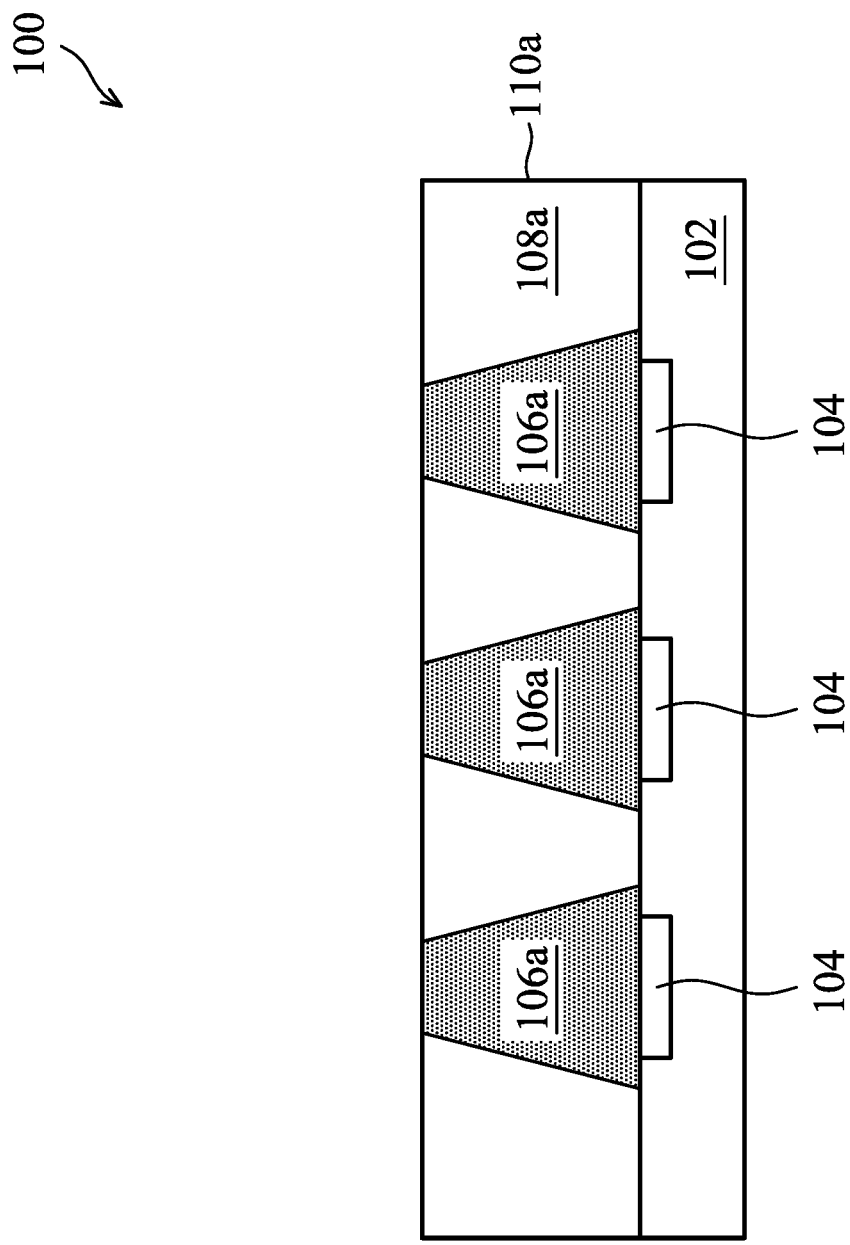

Next, as shown in FIG. 3, a first light-shielding layer 108a is formed between the first transparent pillars 106a on the substrate 102. In some embodiments, the first light-shielding layer 108a may include a light-shielding material which has absorptivity greater than 90% to a light with a wavelength in a range from 300 nm to 1100 nm. The light-shielding material may include a light-curable material, a thermosetting material, or a combination thereof. In some embodiments, the light-shielding material includes non-transparent photoresist, oil ink, molding compound, solder mask, other suitable materials, or a combination thereof. In some embodiments, the light-shielding material may be disposed between the first transparent pillars 106a on the substrate 102, and a curing process such as a UV-curing process, a thermosetting process, or a combination thereof may be performed to cure the light-shielding material to form the first light-shielding layer 108a. In some embodiments, a single light-shielding material is used to form the first light-shielding layer 108a. In this way, the process may be simplified, and the production time and cost may be reduced.

Next, a planarization process such as a chemical mechanical polishing (CMP) process may be performed on the first transparent pillars 106a and the first light-shielding layer 108a to remove the excess light-shielding materials so that the top surfaces of the first transparent pillars 106a and the first light-shielding layer 108a are coplanar. Therefore, the first light collimating layer 110a including the first transparent pillars 106a and the first light-shielding layer 108a is formed.

Figure 4:
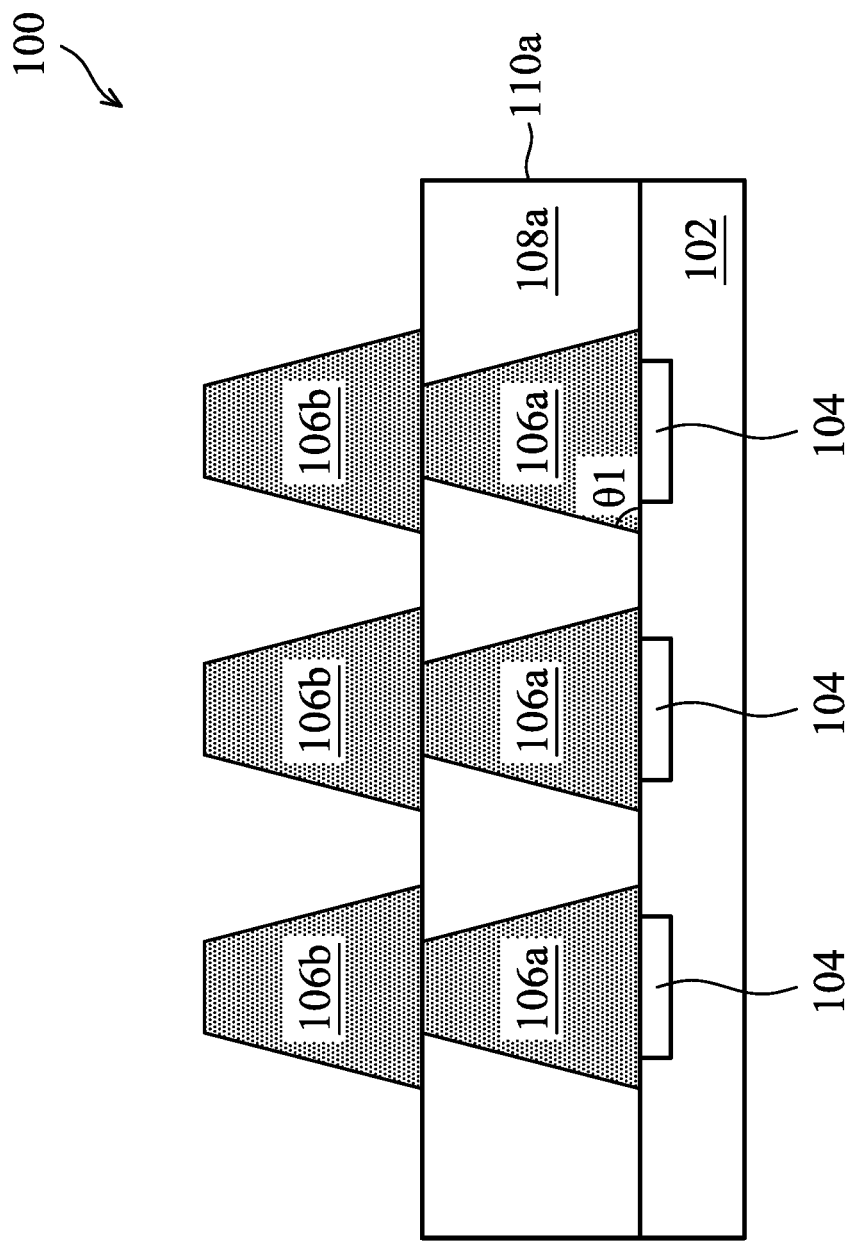

Next, as shown in FIG. 4, second transparent pillars 106b are formed on the first transparent pillars 106a and the first light-shielding layer 108a, and the second transparent pillars 106b are correspondingly disposed on the first transparent pillars 106a. In some embodiments, the processes for forming the second transparent pillars 106b are the same as, or similar to, those used to form the first transparent pillars 106a. For the purpose of brevity, the descriptions of these processes are not repeated herein. In some other embodiments, the materials of the second transparent pillars 106b and the first transparent pillars 106a are different, depending on the demands of the process.

In some embodiments, the second transparent pillars 106b and the first transparent pillars 106a have the same shape and size in a cross-sectional view. For example, as shown in FIG. 4, the second transparent pillars 106b and the first transparent pillars 106a are both upwardly tapered trapezoids with the same size in the cross-sectional view. In this way, it is easier to form the light-shielding layer between the transparent pillars, preventing forming voids between the transparent pillars and the light-shielding layer and reducing the collimating effect. In addition, since the bottom surface area of each of the second transparent pillars 106b and each of the first transparent pillars 106a is greater than its top surface area, the top surface area of each of the first transparent pillars 106a is not equal to the bottom surface area of each of the second transparent pillars 106b. For example, the top surface area of each of the first transparent pillars 106a is smaller than the bottom surface area of each of the second transparent pillars 106b. In this way, the overlay alignment while forming the second transparent pillars 106b may be improved, preventing the overlay area of the second transparent pillars 106b and the first transparent pillars 106a from being reduced due to misalignment, and the collimating effect may be improved and the yield may be raised. In some embodiments, the angle $\theta 1$ between the sidewalls and the bottom surfaces of each of the second transparent pillars 106b and each of the first transparent pillars 106a is between 30° and 89°. If the angle $\theta 1$ is too great, the collimating effect may be reduced due to misalignment of the second transparent pillars 106b and the first transparent pillars 106a. If the angle $\theta 1$ is too less, the overlay area of the second transparent pillars 106b and the first transparent pillars 106a may be too small and the amount of light absorbed by the pixels 104 underneath are reduced.

Figure 5:
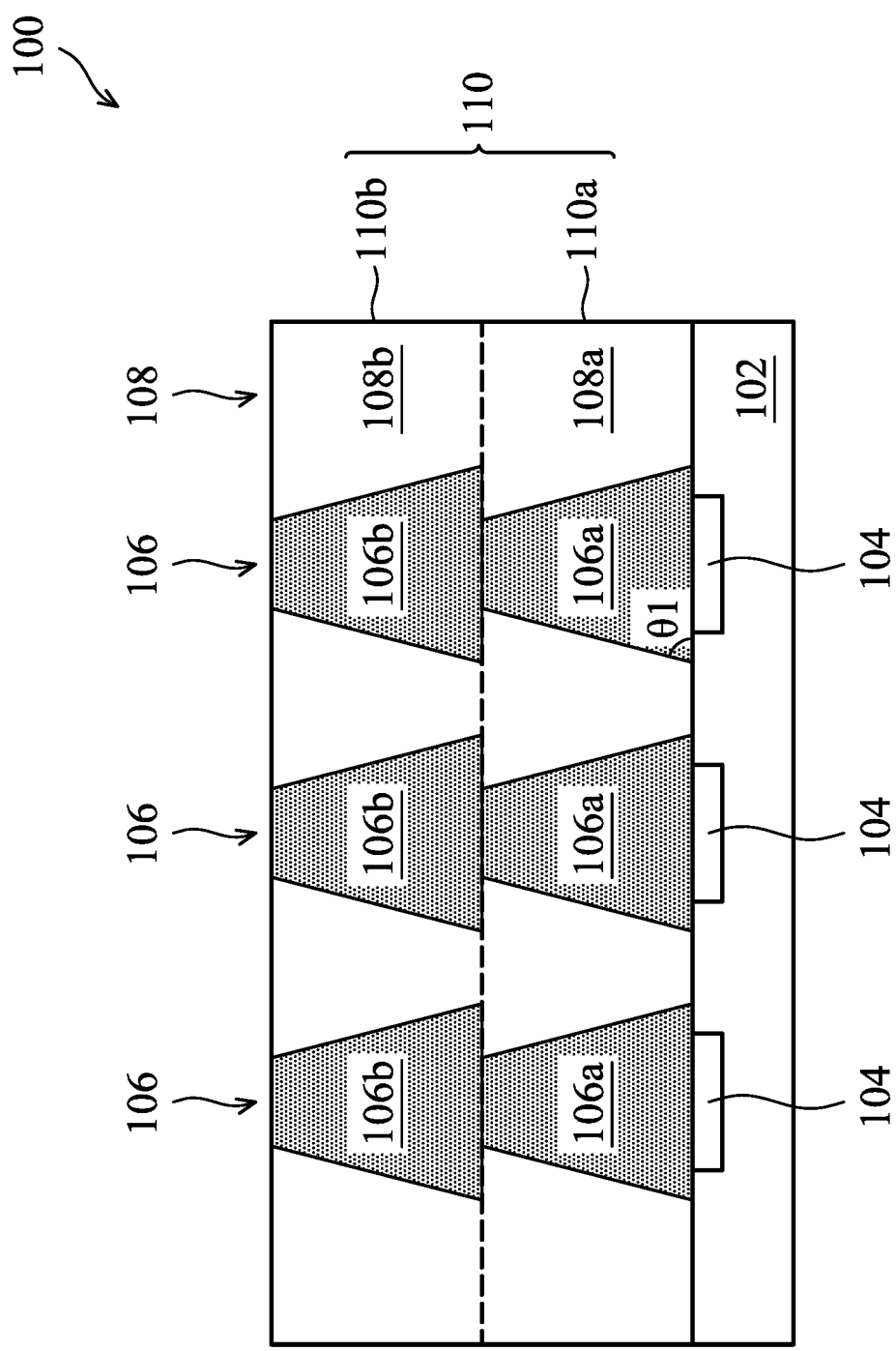

Next, as shown in FIG. 5, a second light-shielding layer 108b is formed between the second transparent pillars 106b on the first light collimating layer 110a. In some embodiments, the processes for forming the second light-shielding layer 108b are the same as, or similar to, those used to form the first light-shielding layer 108a. For the purpose of brevity, the descriptions of these processes are not repeated herein. In some other embodiments, the materials of the second light-shielding layer 108b and the first light-shielding layer 108a are different, depending on the demands of the process. In FIG. 5, since the second light-shielding layer 108b and the first light-shielding layer 108a are made of a single light-shielding material, and the second transparent pillars 106b and the first transparent pillars 106a are also made of a single transparent material, there is no obvious interface between them and the interface are shown by a dash line.

Next, a planarization process such as a chemical mechanical polishing (CMP) process may be performed on the second transparent pillars 106b and the second light-shielding layer 108b to remove the excess light-shielding materials so that the top surfaces of the second transparent pillars 106b and the second light-shielding layer 108b are coplanar. Therefore, the second light collimating layer 110b including the second transparent pillars 106b and the second light-shielding layer 108b is formed.

As shown in FIG. 5, the light collimating layer 110 of the optical sensor 100 includes the first light collimating layer 110a and the second light collimating layer 110b. The transparent pillars 106 include the first transparent pillars 106a and the second transparent pillars 106b, and the light-shielding layer 108 includes the first light-shielding layer 108a and the second light-shielding layer 108b. By forming the first light collimating layer 110a and the second light collimating layer 110b respectively, the aspect ratio of the transparent pillars 106 may be raised, and the transparent pillars 106 may not be deformed and collapse due to too high transparent pillars 106 in a single process. In some embodiments, the aspect ratio (i.e., the total aspect ratio of the first transparent pillars 106a and the second transparent pillars 106b) of the transparent pillars 106 is in a range of between 1:1 and 10:1.

In some embodiments, there may be some other optical devices on the light collimating layer 110, such as color filters, glass, microlenses, or transparent layers (not shown). The incident light passes through the optical devices above the light collimating layer 110 and through the transparent pillars 106 to illuminate the pixels 104. In some embodiments, the second transparent pillars 106b and the first transparent pillars 106a are disposed directly above the pixels 104. As a result, the amount of the light illuminating the pixels 104 may be increased.

It should be noted that, the number of layers of the light collimating layer in FIG. 5 is merely an example, and the present disclosure is not limited thereto. In the present disclosure, the light collimating layer may also include at least three layers of light collimating layers, depending on the demand of process and design.

As mentioned above, by forming the light collimating layer of an optical sensor by layers, the total aspect ratio of the transparent pillars may be raised, preventing deformation and collapse of too high transparent pillars. Moreover, by modifying the shape and the size of the transparent pillars in each layer in a cross-sectional view, such as making the bottom surface area of each of the transparent pillars in each layer larger than its top surface area, a void may be prevented to be formed between the transparent pillars and the light-shielding layer. Furthermore, by making the top surface area of the lower transparent pillars not equal to the bottom surface area of the upper transparent pillars, it may prevent the overlay area from being reduced due to misalignment of transparent pillars of each layer. The collimating effect may be improved further and the yield may be raised.

Figure 6:
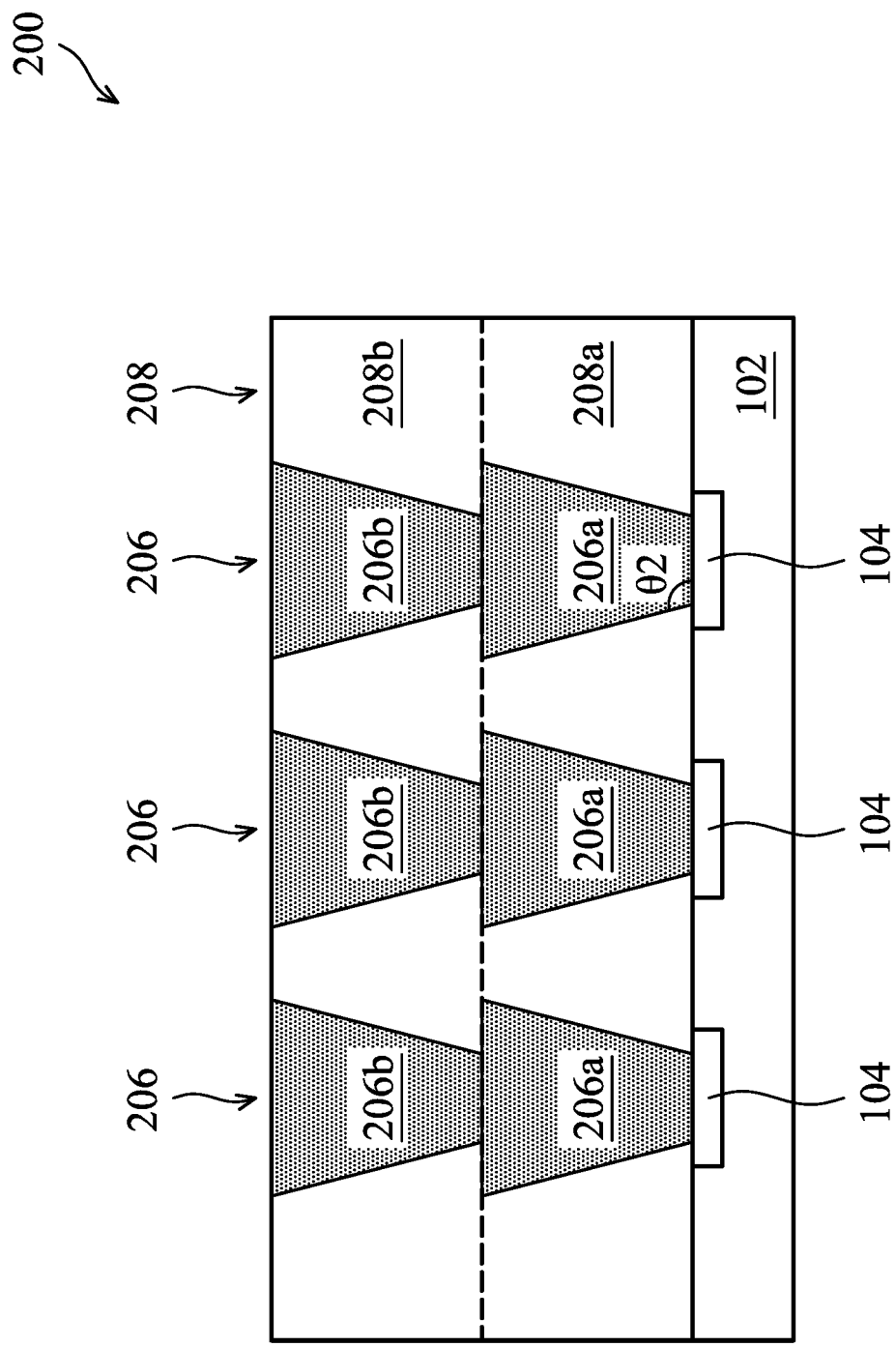
FIG. 6 is a cross-sectional representation of an optical sensor in accordance with some other embodiments.

FIG. 6 is a cross-sectional representation of an optical sensor 200 in accordance with some other embodiments. Some processes or devices are the same as, or similar to, those described in the embodiments above, and therefore the descriptions, the reference numerals, and/or letters may be repeated herein. The difference from the embodiments described above is that, as shown in FIG. 6 in accordance with some embodiments, the first transparent pillars 206a and the second transparent pillars 206b are downwardly tapered trapezoids. In some embodiments, the shapes of the first transparent pillars 206a and the second transparent pillars 206b in the cross-sectional view may be changed by modifying the exposure focal length of the patterning process. The process alignment capability may be enhanced by forming the light-shielding layers 208a and 208b between the downwardly tapered trapezoid transparent pillars 206a and 206b.

In some embodiments, the second transparent pillars 206b and the first transparent pillars 206a have the same shape and size in a cross-sectional view. For example, as shown in FIG. 6, the second transparent pillars 206b and the first transparent pillars 206a are both downwardly tapered trapezoids with the same size in the cross-sectional view. In addition, since the top surface area of each of the second transparent pillars 206b and the first transparent pillars 206a is greater than its bottom surface area, the top surface area of each of the first transparent pillars 206a is not equal to the bottom surface area of each of the second transparent pillars 206b. For example, the top surface area of each of the first transparent pillars 206a is larger than the bottom surface area of each of the second transparent pillars 206b. In this way, the overlay alignment while forming the second transparent pillars 206b may be improved, preventing the overlay area of the second transparent pillars 206b and the first transparent pillars 206a from being reduced due to misalignment, and the collimating effect may be improved and the yield may be raised. In some embodiments, the angle θ2 between the sidewalls and the bottom surfaces of each of the second transparent pillars 206b and each of the first transparent pillars 206a is between 91° and 150°. If the angle θ2 is too less, the collimating effect may be reduced due to misalignment of the second transparent pillars 206b and the first transparent pillars 206a. If the angle θ2 is too great, the overlay area of the second transparent pillars 206b and the first transparent pillars 206a may be too small and the amount of light absorbed by the pixels 104 underneath are reduced.

As shown in the embodiments in FIG. 6, by forming the light collimating layer of an optical sensor by layers, the total aspect ratio of the transparent pillars may be raised, preventing deformation and collapse of too high transparent pillars. Moreover, since the top surface area of each of the transparent pillars in each layer is larger than its bottom surface area, the top surface area of the lower transparent pillars not equal to the bottom surface area of the upper transparent pillars, it may prevent the overlay area from being reduced due to misalignment of transparent pillars of each layer. The collimating effect may be improved further and the yield may be raised.

Figure 7:
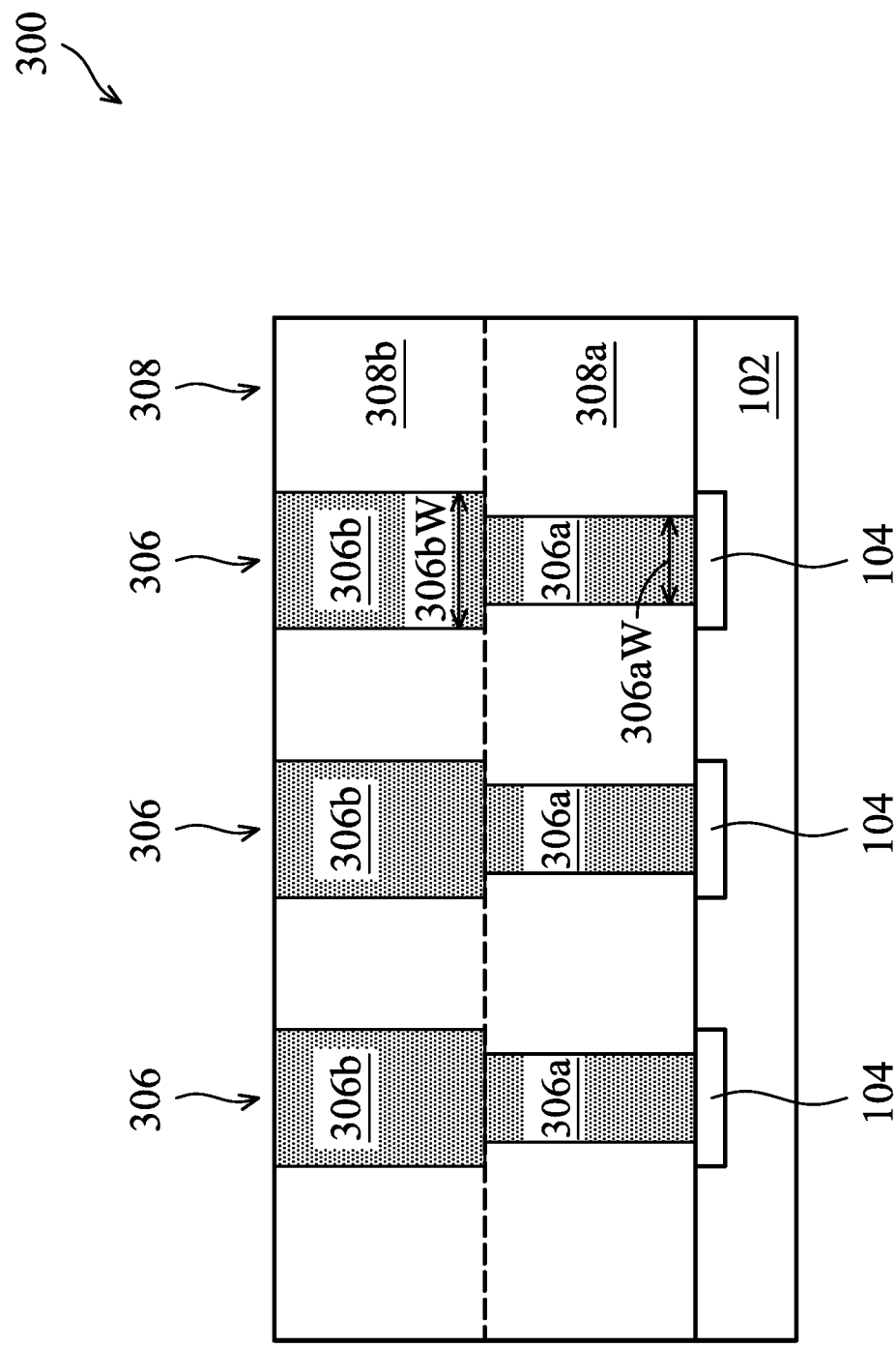
FIG. 7 is a cross-sectional representation of an optical sensor in accordance with some other embodiments.

FIG. 7 is a cross-sectional representation of an optical sensor 300 in accordance with some further embodiments. Some processes or devices are the same as, or similar to, those described in the embodiments above, and therefore the descriptions, the reference numerals, and/or letters may be repeated herein. The difference from the embodiments described above is that, as shown in FIG. 7 in accordance with some embodiments, the first transparent pillars 306a and the second transparent pillars 306b are rectangles with different sizes in a cross-sectional view, and the first transparent pillars 306a is smaller than the second transparent pillars 306b in a cross-sectional view. In some embodiments, the first transparent pillars 306a and the second transparent pillars 306b may be formed by different patterned mask, and the first transparent pillars 306a and the second transparent pillars 306b with different sizes are formed.

Since the second transparent pillars 306b has a diameter 306bW larger than the diameter 306aW of the first transparent pillars 306a, the top surface area of each of the first transparent pillars 306a is not equal to the bottom surface area of each of the second transparent pillars 306b. For example, the top surface area of each of the first transparent pillars 306a is smaller than the bottom surface area of each of the second transparent pillars 306b. In this way, the overlay alignment while forming the second transparent pillars 306b may be improved, preventing the overlay area of the second transparent pillars 306b and the first transparent pillars 306a from being reduced due to misalignment, and the collimating effect may be improved and the yield may be raised. In some embodiments, the ratio between the diameter 306bW of the second transparent pillars 306b and the diameter 306aW of the first transparent pillars 306a is between 1 and 10. If the ratio between the diameter 306bW of the second transparent pillars 306b and the diameter 306aW of the first transparent pillars 306a is too less, the second transparent pillars 306b and the first transparent pillars 306a may be misaligned and the collimating effect may be reduced. If the ratio between the diameter 306bW of the second transparent pillars 306b and the diameter 306aW of the first transparent pillars 306a is too great, the overlay area of the second transparent pillars 306b and the first transparent pillars 306a may be too small and the amount of light absorbed by the pixels 104 underneath may be reduced.

As shown in the embodiments in FIG. 7, by forming the light collimating layer of an optical sensor by layers, the total aspect ratio of the transparent pillars may be raised, preventing deformation and collapse of too high transparent pillars. Moreover, since the diameter of the upper transparent pillars is larger than the diameter of the lower transparent pillars, the top surface area of the lower transparent pillars is not equal to the bottom surface area of the upper transparent pillars. It may prevent the overlay area from being reduced due to misalignment of transparent pillars of each layer. The collimating effect may be improved further and the yield may be raised.

Figure 8:
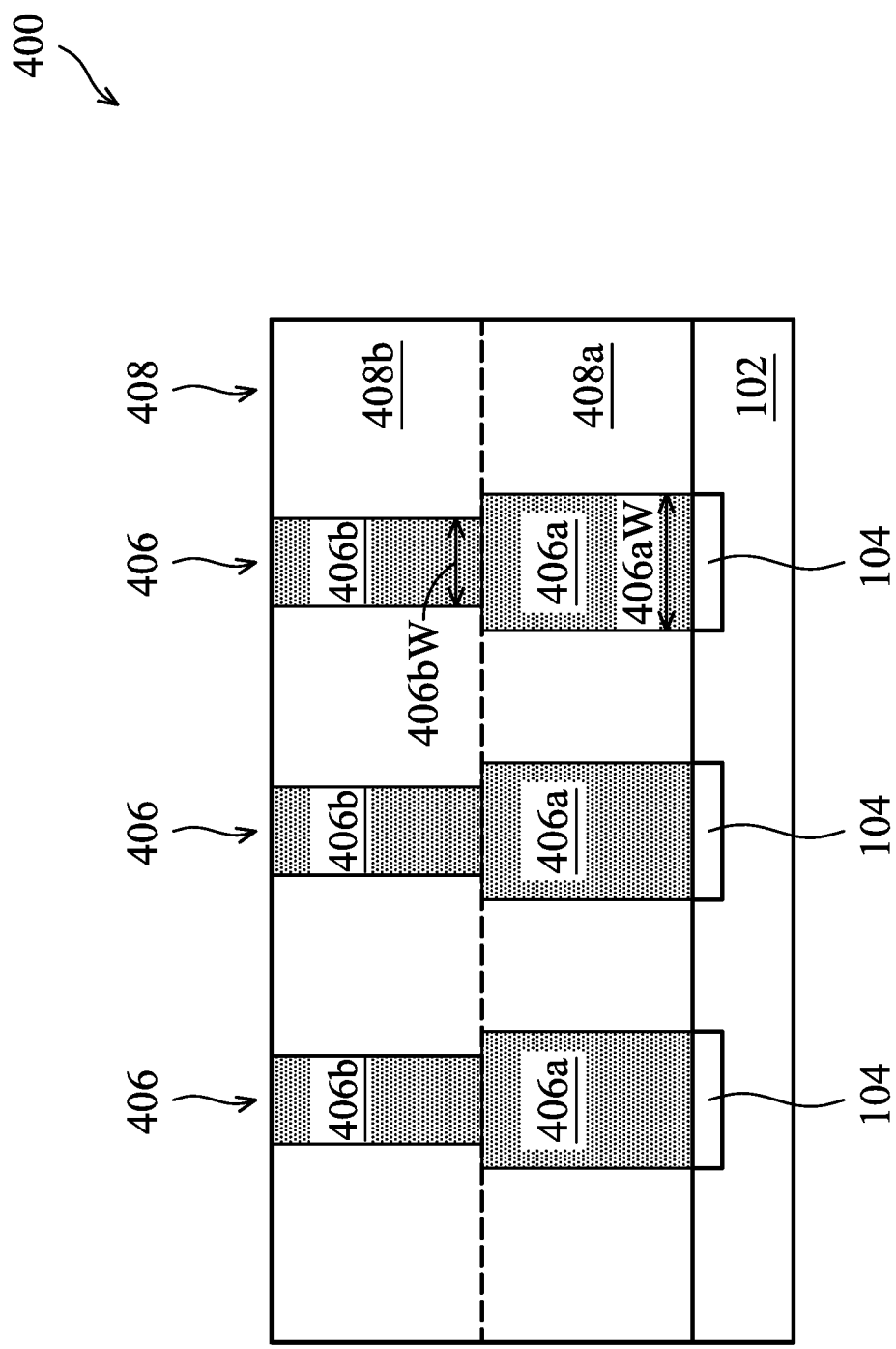
FIG. 8 is a cross-sectional representation of an optical sensor in accordance with some other embodiments.

FIG. 8 is a cross-sectional representation of an optical sensor 400 in accordance with some further embodiments. Some processes or devices are the same as, or similar to, those described in the embodiments above, and therefore the descriptions, the reference numerals, and/or letters may be repeated herein. The difference from the embodiments described above is that, as shown in FIG. 8 in accordance with some embodiments, the first transparent pillars 406a and the second transparent pillars 406b are rectangles with different sizes in a cross-sectional view, and the first transparent pillars 406a is larger than the second transparent pillars 406b in a cross-sectional view. In some embodiments, the first transparent pillars 406a and the second transparent pillars 406b may be formed by different patterned mask, and the first transparent pillars 406a and the second transparent pillars 406b with different sizes are formed.

Since the first transparent pillars 406a has a diameter 406aW larger than the diameter 406bW of the second transparent pillars 406a, the top surface area of each of the first transparent pillars 406a is not equal to the bottom surface area of each of the second transparent pillars 406b. For example, the top surface area of each of the first transparent pillars 406a is larger than the bottom surface area of each of the second transparent pillars 406b. In this way, the overlay alignment while forming the second transparent pillars 406b may be improved, preventing the overlay area of the second transparent pillars 406b and the first transparent pillars 406a from being reduced due to misalignment, and the collimating effect may be improved and the yield may be raised. In some embodiments, the ratio between the diameter 406bW of the second transparent pillars 406b and the diameter 406aW of the first transparent pillars 406a is between 0.1 and 0.99. If the ratio between the diameter 406bW of the second transparent pillars 406b and the diameter 406aW of the first transparent pillars 406a is too great, the second transparent pillars 406b and the first transparent pillars 406a may be misaligned and the collimating effect may be reduced. If the ratio between the diameter 406bW of the second transparent pillars 406b and the diameter 406aW of the first transparent pillars 406a is too less, the overlay area of the second transparent pillars 406b and the first transparent pillars 406a may be too small and the amount of light absorbed by the pixels 104 underneath are reduced.

As shown in the embodiments in FIG. 8, by forming the light collimating layer of an optical sensor by layers, the total aspect ratio of the transparent pillars may be raised, preventing deformation and collapse of too high transparent pillars. Moreover, since the diameter of the upper transparent pillars is smaller than the diameter of the lower transparent pillars, the top surface area of the lower transparent pillars is not equal to the bottom surface area of the upper transparent pillars. It may prevent the overlay area from being reduced due to misalignment of transparent pillars of each layer. The collimating effect may be improved further and the yield may be raised.

Figure 9:
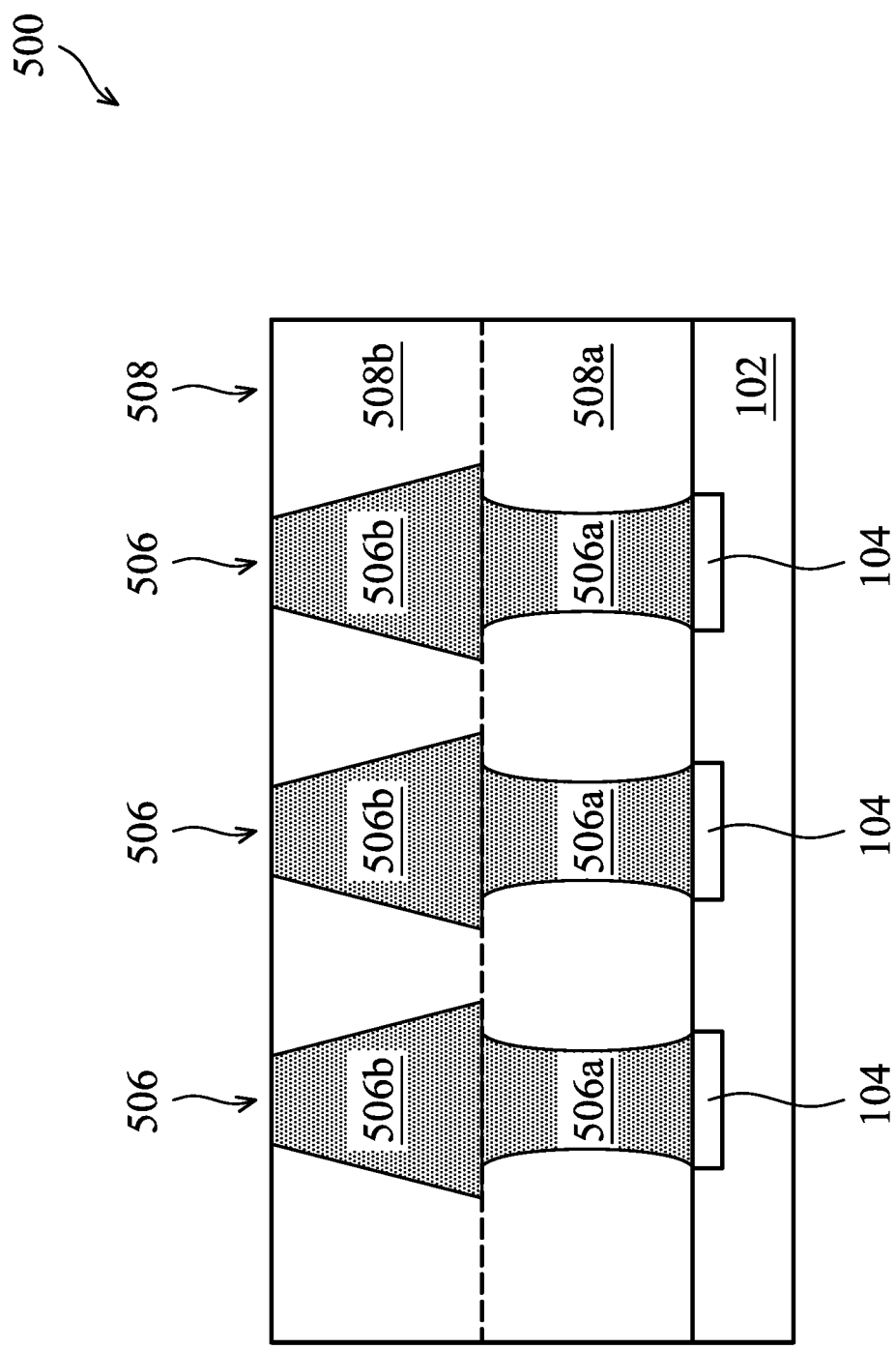
FIG. 9 is a cross-sectional representation of an optical sensor in accordance with some other embodiments.

FIG. 9 is a cross-sectional representation of an optical sensor 500 in accordance with some further embodiments. Some processes or devices are the same as, or similar to, those described in the embodiments above, and therefore the descriptions, the reference numerals, and/or letters may be repeated herein. The difference from the embodiments described above is that, as shown in FIG. 9 in accordance with some embodiments, the first transparent pillars 506a and the second transparent pillars 506b have different shapes in a cross-sectional view. For example, the first transparent pillars 506a are double concave shapes, and the second transparent pillars 506b are trapezoids. In some embodiments, the cross-sectional shapes of the first transparent pillars 506a and the second transparent pillars 506b may be changed by modifying the exposure focal length in the patterning process.

By freely modifying the shapes and sizes of the transparent pillars 506a and the second transparent pillars 506b in the cross-sectional view, the bottom surface area of each of the transparent pillars 506a and the second transparent pillars 506b is larger than its top surface area, making it easier to form the light-shielding layer between the transparent pillars, preventing voids being formed between the transparent pillars and the light-shielding layer, and the collimating effect may be reduced. In addition, the top surface area of each of the first transparent pillars 506a is not equal to the bottom surface area of each of the second transparent pillars 506b, the overlay alignment while forming the second transparent pillars 506b may be improved, preventing the overlay area of the second transparent pillars 506b and the first transparent pillars 506a from being reduced due to misalignment, and the collimating effect may be improved and the yield may be raised.

It should be noted that, the shapes, sizes, and the ratio of the first transparent pillars and the second transparent pillars in FIG. 9 is merely an example, and the present disclosure is not limited thereto. In the present disclosure, the light collimating layer may also include a combination of transparent pillars of any shape, size, and ratio, depending on the demand of the process and the design.

As shown in the embodiments in FIG. 9, by forming the light collimating layer of an optical sensor by layers, the total aspect ratio of the transparent pillars may be raised, preventing deformation and collapse of too high transparent pillars. Moreover, by freely modifying the shapes, sizes, and the ratio of the transparent pillars of each layer, for example, making the bottom surface area of the transparent pillars in each layer larger than its top surface area, the void formed between the transparent pillars and the light-shielding layer may be prevented. By making the top surface area of the lower transparent pillars not equal to the bottom surface area of the upper transparent pillars, it may prevent the overlay area from being reduced due to misalignment of transparent pillars of each layer. The collimating effect may be improved further and the yield may be raised.

Figure 10:
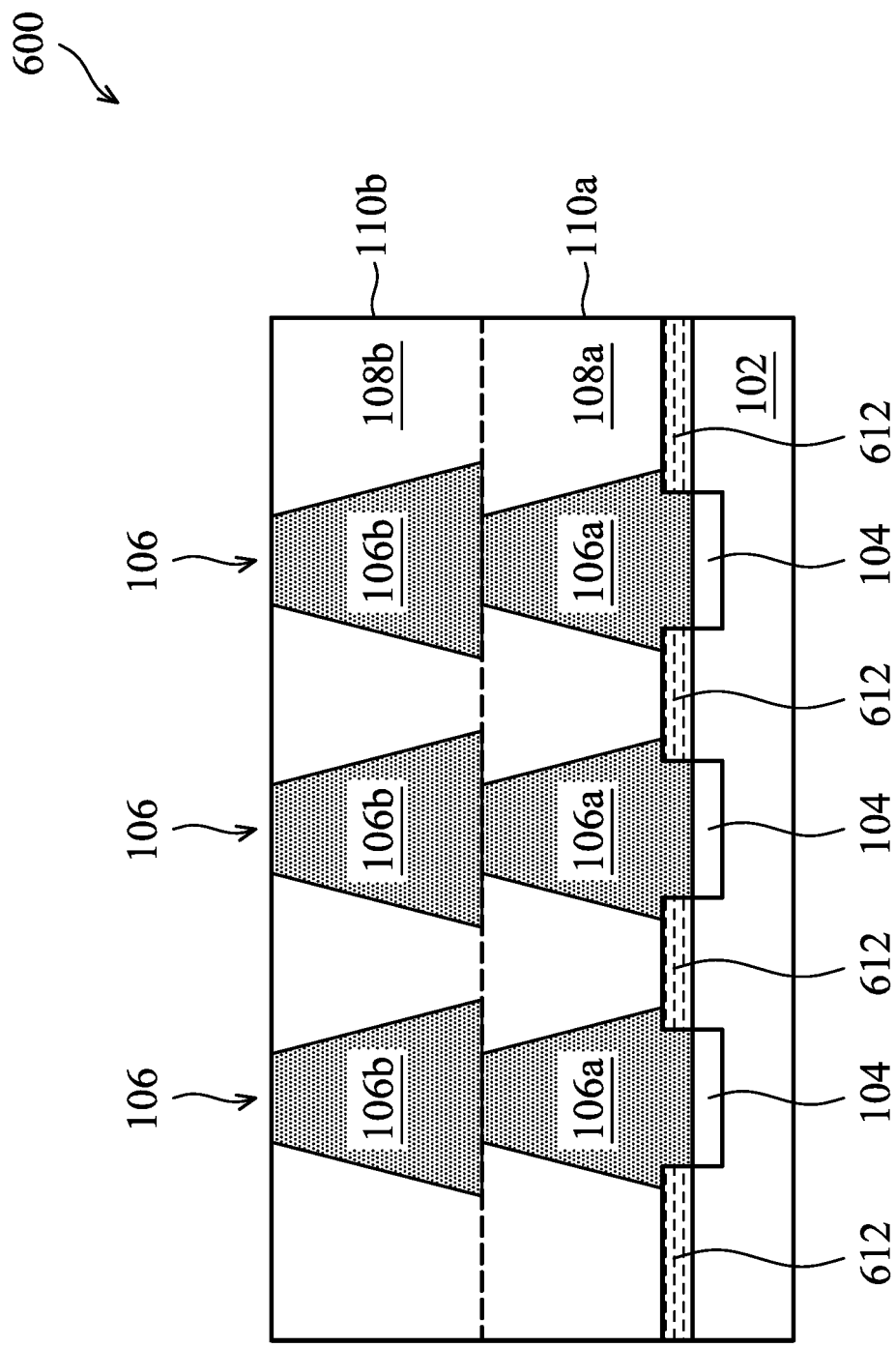
FIG. 10 is a cross-sectional representation of an optical sensor in accordance with some other embodiments.

FIG. 10 is a cross-sectional representation of an optical sensor 600 in accordance with some further embodiments. Some processes or devices are the same as, or similar to, those described in the embodiments above, and therefore the descriptions, the reference numerals, and/or letters may be repeated herein. The difference from the embodiments described above is that, as shown in FIG. 10 in accordance with some embodiments, the optical sensor 600 further includes a bottom light-shielding layer 612. The bottom light-shielding layer 612 is disposed between the pixels 104 over the substrate 102, and the bottom light-shielding layer 612 is disposed beneath the first light collimating layer 110a. In some embodiments, the material of the bottom light-shielding layer 612 is different from that of the subsequently formed first light-shielding layer 108a and second light-shielding layer 108b. In some embodiments, the bottom light-shielding layer 612 may include a light-curing material which has an absorptivity greater than 90% to a light with a wavelength in a range from 300 nm to 1100 nm. In some embodiments, the light-curing material may include a non-transparent photosensitive resin, a black light-shielding resin, other suitable materials, or a combination thereof. In some embodiments, the light-curing material may be disposed over substrate 102 and then a curing process such as a light-curing process may be performed to cure the light-curing material, and the bottom light-shielding layer 612 is formed over the substrate 102 between the pixels 104.

In some embodiments, the bottom light-shielding layer 612 disposed between the pixels 104 on the substrate 102 may prevent the light from entering the region without pixels 104 of the substrate 102 and generating noise of optical signal.

As shown in the embodiments in FIG. 10, by forming the light collimating layer of an optical sensor by layers, the total aspect ratio of the transparent pillars may be raised, preventing deformation and collapse of too high transparent pillars. Moreover, by forming a bottom light-shielding layer between the pixels on the substrate, the noise of optical signal may be reduced. By making the top surface area of the lower transparent pillars not equal to the bottom surface area of the upper transparent pillars, it may prevent the overlay area from being reduced due to misalignment of transparent pillars of each layer. The collimating effect may be improved further and the yield may be raised.

Figure 11:
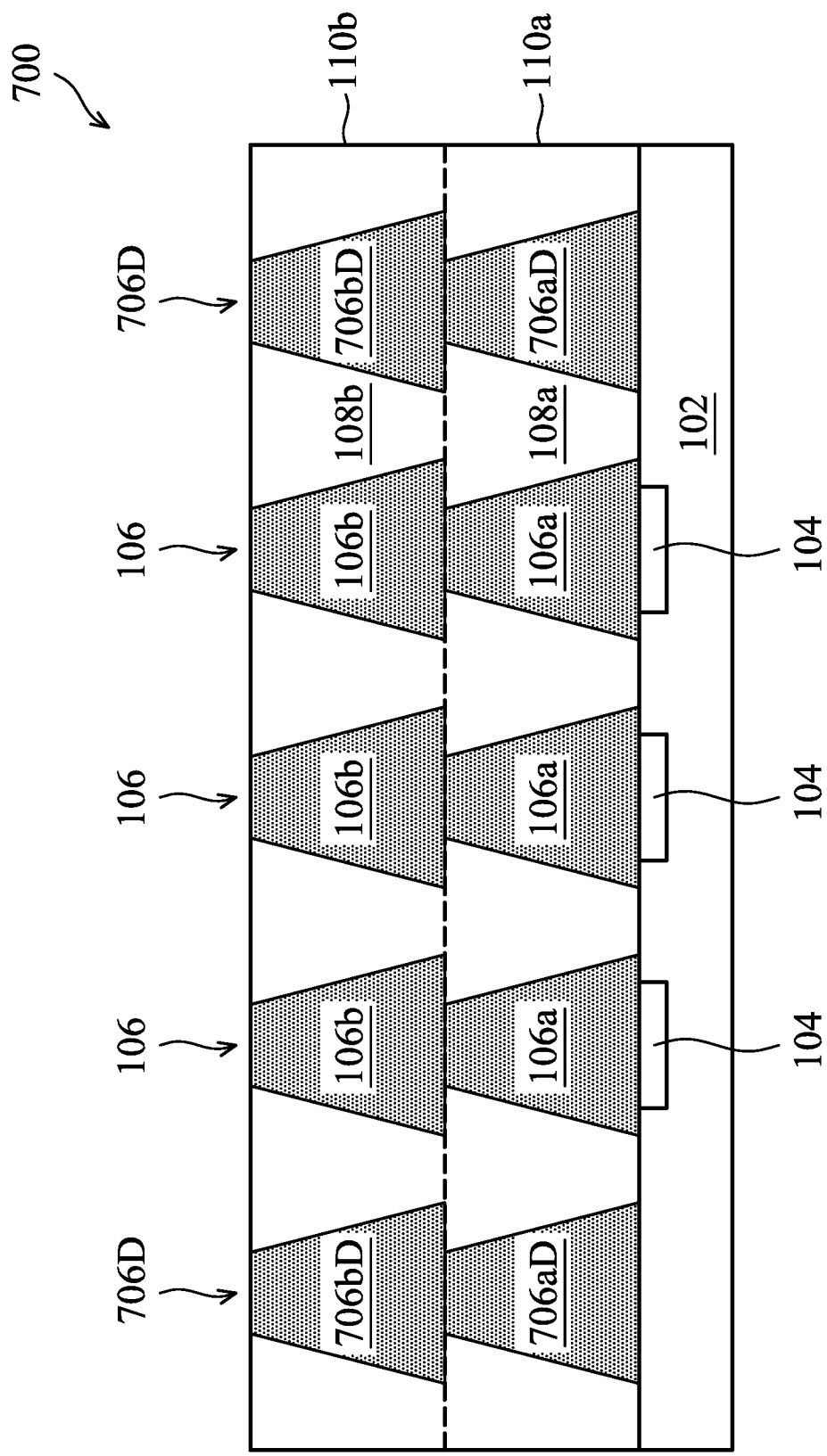
FIG. 11 is a cross-sectional representation of an optical sensor in accordance with some other embodiments.

FIG. 11 is a cross-sectional representation of an optical sensor 700 in accordance with some further embodiments. Some processes or devices are the same as, or similar to, those described in the embodiments above, and therefore the descriptions, the reference numerals, and/or letters may be repeated herein. The difference from the embodiments described above is that, as shown in FIG. 11 in accordance with some embodiments, the first light collimating layer 110a further includes first dummy transparent pillars 706aD through the first light-shielding layer 108a and disposed in the first light collimating layer 110a on the peripheral region of the substrate 102. The second light collimating layer 110b further includes second dummy transparent pillars 706bD through the second light-shielding layer 108b correspondingly disposed on the first dummy transparent pillars 706aD. In some embodiments as shown in FIG. 11, the first dummy transparent pillars 706aD do not correspond to any pixel 104 beneath.

In some embodiments, the first dummy transparent pillars 706aD and the second dummy transparent pillars 706bD are formed on the peripheral region of the substrate 102 while forming the first transparent pillars 106a and the second transparent pillars 106b respectively. Moreover, they are made of the same material of each of the first transparent pillars 106a and each of the second transparent pillars 106b. In this way, the production time and cost may be saved.

In some embodiments, the pixels 104 are arranged in an array. Therefore, the transparent pillars 106 may also be arranged in an array. The transparent pillars 106 at the edge of the array may collapse or deform due to the cohesion force between the transparent material molecules. By forming dummy transparent pillars 706D (including the first dummy transparent pillars 706aD and the second dummy transparent pillars 706bD) at the edge of the transparent pillars 106 array as a stress buffer providing physical support, the transparent pillars 106 array structure may be strengthened, avoiding the transparent pillars 106 at the edge of the array deform or collapse. The uniformity of the transparent pillars 106 may remain and the yield may be raised.

It should be noted that the shapes and sizes of the dummy transparent pillars and the transparent pillars in FIG. 11 are merely an example, and the present disclosure is not limited thereto. In the present disclosure, the dummy transparent pillars may also be any number, arrangement, shape, size, and ratio, depending on the demand of the process and the design.

As shown in the embodiments in FIG. 11, by forming the light collimating layer of an optical sensor by layers, the total aspect ratio of the transparent pillars may be raised. Moreover, by disposing dummy transparent pillars around the transparent pillars, the transparent pillars structure may be further enhanced, avoiding deformation and collapse of too high transparent pillars. By making the top surface area of the lower transparent pillars not equal to the bottom surface area of the upper transparent pillars, it may prevent the overlay area from being reduced due to misalignment of transparent pillars of each layer. The collimating effect may be improved further and the yield may be raised.

As mentioned above, the present disclosure provides an optical sensor. By forming the light collimating layer of an optical sensor by layers, the total aspect ratio of the transparent pillars may be raised. By freely modifying the shape, size, and ratio of the transparent pillars in each layer, voids are prevented to be formed between the light-shielding layer and the transparent pillars. By making the top surface area of the lower transparent pillars not equal to the bottom surface area of the upper transparent pillars, it may prevent the overlay area from being reduced due to misalignment of transparent pillars of each layer. Moreover, by forming the light-shielding layer on the substrate between the pixels, the noise of the optical signals may be reduced. By disposing dummy transparent pillars around the transparent pillars, the transparent array structure may be enhanced, preventing the transparent pillars from being too tall to deform and collapse, and the collimating effect may be improved further and the yield may be raised.

It should be noted that although the advantages and effects of some embodiments of the present disclosure have been described above, not all embodiments are required to achieve all of the advantages and benefits.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical sensor, comprising:
   a plurality of pixels disposed in a substrate;
   a light collimating layer disposed on the substrate, comprising:
      a first light-shielding layer disposed on the substrate;
      a plurality of first transparent pillars through the first light-shielding layer correspondingly disposed on the pixels;
      a second light-shielding layer disposed on the first light-shielding layer and the first transparent pillars; and
      a plurality of second transparent pillars through the second light-shielding layer correspondingly disposed on the first transparent pillars, wherein a top surface area of each of the first transparent pillars is not equal to a bottom surface area of each of the second transparent pillars, wherein each of the first transparent pillars and the second transparent pillars has a total aspect ratio of between 1:1 and 30:1.

2. The optical sensor as claimed in claim 1, wherein the first transparent pillars and the second transparent pillars have a same cross-sectional shape.

3. The optical sensor as claimed in claim 1, wherein the first transparent pillars and the second transparent pillars have a different cross-sectional shape.

4. The optical sensor as claimed in claim 1, wherein the first transparent pillars and the second transparent pillars have a same cross-sectional size.

5. The optical sensor as claimed in claim 1, wherein the first transparent pillars and the second transparent pillars have a different cross-sectional size.

6. The optical sensor as claimed in claim 1, wherein a bottom surface area of each of the first transparent pillars and each of the second transparent pillars is not equal to a top surface area of each of the first transparent pillars and each of the second transparent pillars.

7. The optical sensor as claimed in claim 1, wherein a bottom surface area of each of the first transparent pillars and each of the second transparent pillars is equal to a top surface area of each of the first transparent pillars and each of the second transparent pillars.

8. The optical sensor as claimed in claim 1, wherein a sidewall of each of the first transparent pillars and each of the second transparent pillars is not perpendicular to a bottom surface of each of the first transparent pillars and each of the second transparent pillars.

9. The optical sensor as claimed in claim 1, wherein a sidewall of each of the first transparent pillars and each of the second transparent pillars is perpendicular to a bottom surface of each of the first transparent pillars and each of the second transparent pillars.

10. The optical sensor as claimed in claim 1, wherein the first transparent pillars and the second transparent pillars are made of the same material, and the first light-shielding layer and the second light-shielding layer are made of the same material.

11. The optical sensor as claimed in claim 1, further comprising:
a bottom light-shielding layer disposed below the first light-shielding layer and above the substrate between the pixels.

12. The optical sensor as claimed in claim 11, wherein the bottom light-shielding layer is made of a different material than the first light-shielding layer and the second light-shielding layer.

13. The optical sensor as claimed in claim 1, further comprising:
a first dummy transparent pillar through the first light-shielding layer disposed on the substrate in a peripheral region of the light collimating layer and not corresponded to any of the pixels; and
a second dummy transparent pillar through the second light-shielding layer correspondingly disposed on the first dummy transparent pillar.

14. A method for forming the optical sensor as set forth in claim 1, comprising:
forming a plurality of pixels in a substrate;
forming a light collimating layer on the substrate, wherein forming of the light collimating layer comprises:
forming a plurality of first transparent pillars on the substrate, wherein the first transparent pillars are correspondingly disposed on the pixels;
forming a first light-shielding layer between the first transparent pillars;
planarizing a top surface of the first transparent pillars and the first light-shielding layer;
forming a plurality of second transparent pillars on the first transparent pillars and the first light-shielding layer, wherein the second transparent pillars are correspondingly disposed on the first transparent pillars;
forming a second light-shielding layer between the second transparent pillars; and
planarizing a top surface of the second transparent pillars and the second light-shielding layer,
wherein a top surface area of each of the first transparent pillars is not equal to a bottom surface area of each of the second transparent pillars.

15. The method for forming an optical sensor as claimed in claim 14, wherein each of the first transparent pillars and the second transparent pillars has a total aspect ratio of between 1:1 and 30:1.

16. The method for forming an optical sensor as claimed in claim 14, wherein the first transparent pillars and the second transparent pillars are made of the same material, and the first light-shielding layer and the second light-shielding layer are made of the same material.

17. The method for forming an optical sensor as claimed in claim 14, further comprising:
forming a bottom light-shielding layer on the substrate between the pixels, wherein the bottom light-shielding layer is disposed under the first light-shielding layer.

18. The method for forming an optical sensor as claimed in claim 17, wherein the bottom light-shielding layer is made of a different material than the first light-shielding layer and the second light-shielding layer.

19. The method for forming an optical sensor as claimed in claim 14, further comprising:
forming a first dummy transparent pillar in a peripheral region of the light collimating layer, wherein the first dummy transparent pillar does not correspond to any of the pixels; and
forming a second dummy transparent pillar correspondingly disposed on the first dummy transparent pillar.

* * * * *